United States Patent
Ozery

(10) Patent No.: US 10,067,737 B1
(45) Date of Patent: Sep. 4, 2018

(54) SMART AUDIO AUGMENTED REALITY SYSTEM

(71) Applicant: DAQRI, LLC, Los Angeles, CA (US)

(72) Inventor: Gal Ozery, Los Angeles, CA (US)

(73) Assignee: DAQRI, LLC, Los Angeles, CA (US)

( * ) Notice: Subject to any disclaimer, the term of this patent is extended or adjusted under 35 U.S.C. 154(b) by 0 days.

(21) Appl. No.: 15/691,602

(22) Filed: Aug. 30, 2017

(51) Int. Cl.
| | |
|---|---|
| G06F 3/16 | (2006.01) |
| H04R 1/40 | (2006.01) |
| H04R 3/00 | (2006.01) |
| H04R 29/00 | (2006.01) |
| G06T 19/00 | (2011.01) |
| H03G 3/32 | (2006.01) |
| G02B 27/01 | (2006.01) |

(52) U.S. Cl.
CPC ......... *G06F 3/165* (2013.01); *G02B 27/0172* (2013.01); *G06T 19/006* (2013.01); *H03G 3/32* (2013.01); *H04R 1/406* (2013.01); *H04R 3/005* (2013.01); *H04R 29/005* (2013.01); *G02B 2027/014* (2013.01); *G02B 2027/0138* (2013.01); *G02B 2027/0141* (2013.01); *H04R 2499/15* (2013.01)

(58) Field of Classification Search
CPC ...... G02B 27/01; G02B 27/017; G08B 21/18; G06F 3/165; H04R 29/005
USPC .............................. 700/94; 345/633; 359/360
See application file for complete search history.

(56) References Cited

U.S. PATENT DOCUMENTS

| | | |
|---|---|---|
| 2013/0333266 A1 | 12/2013 | Gose et al. |
| 2015/0373474 A1 | 12/2015 | Kraft et al. |
| 2016/0071526 A1 | 3/2016 | Wingate et al. |
| 2016/0306024 A1 | 10/2016 | Buck, Jr. et al. |
| 2016/0342840 A1* | 11/2016 | Mullins .............. G06K 9/00671 |
| 2017/0053440 A1 | 2/2017 | Yoon et al. |
| 2017/0187963 A1 | 6/2017 | Lee et al. |
| 2017/0193769 A1 | 7/2017 | Mcsheffrey |
| 2017/0220863 A1* | 8/2017 | Lection .............. G06K 9/00221 |
| 2017/0374192 A1 | 12/2017 | Gersten |

OTHER PUBLICATIONS

"U.S. Appl. No. 15/691,613, Non Final Office Action dated Apr. 2, 2018", 15 pgs.

"U.S. Appl. No. 15/691,613, Response filed May 2, 2018 to Non Final Office Action dated Apr. 2, 2018", 11 pgs.

\* cited by examiner

*Primary Examiner* — Melur Ramakrishnaiah
(74) *Attorney, Agent, or Firm* — Schwegman Lundberg & Woessner, P.A.

(57) ABSTRACT

A head-mounted device (HMD) has a transparent display and an array of microphones. The HMD determines a task-based context of the HMD based on a task being performed by a user of the HMD, and determines an ambient-based context of the HMD based on audio data produced by the array of microphones. The HMD detects a first notification configured to be displayed in the transparent display of the HMD. The HMD intercepts the first notification in response to detecting the first notification and generates a second notification based on a priority level of the first notification, the task-based context, and the ambient-based context. The second notification includes a combination of an audio notification and a visual notification (AR content). The HMD replaces the first notification with the second notification and provides the second notification at the HMD.

20 Claims, 12 Drawing Sheets

US 10,067,737 B1

SMART AUDIO AUGMENTED REALITY SYSTEM

TECHNICAL FIELD

The subject matter disclosed herein generally relates to an augmented reality system. Specifically, the present disclosure addresses systems and methods for delivery of context-based augmented reality content.

BACKGROUND

An augmented reality (AR) device can be used to generate and display data in addition to an image captured with the AR device. As used herein, AR is or includes a live, direct, or indirect view of a physical, real-world environment whose elements are augmented by computer-generated sensory input such as sound, video, graphics, or Global Positioning System (GPS) data. With the help of advanced AR technology (e.g., adding computer vision and object recognition), the information about the surrounding real world of the user becomes interactive. Device-generated (e.g., artificial) information about the environment and its objects can be overlaid on a view of the real world.

BRIEF DESCRIPTION OF THE DRAWINGS

Some embodiments are illustrated by way of example and not limitation in the figures of the accompanying drawings.

DETAILED DESCRIPTION

Figure 1:
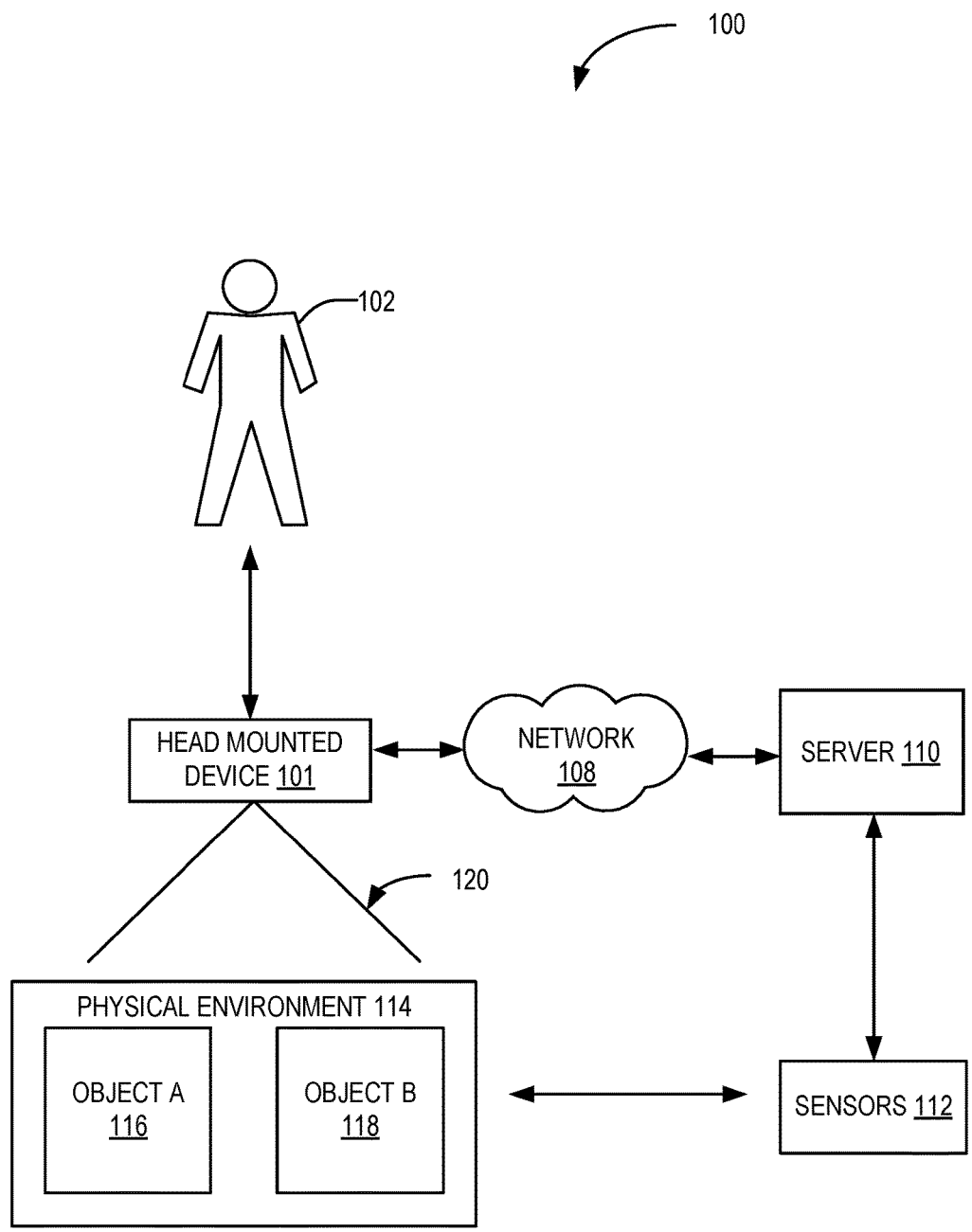
FIG. 1 is a block diagram illustrating an example of a network suitable for operating an AR application of a head-mounted device system, according to some example embodiments.

Example methods and systems are directed to context-based AR content and audio notification in a head-mounted device (HMD). Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

An HMD that displays AR information in a display of the HMD can be used to provide workers with relevant information in their work environment. To promote safe working conditions in hazardous or unorthodox working environments, it is desirable to refrain from obstructing the user's field of view to not disrupt their work. However, a user's field of view can become obstructed by digital content displayed in the display of the HMD. The user's attention is spread across various signals and environmental events, disrupting the user's focus and, potentially, causing danger.

The present disclosure describes an HMD that includes a smart audio system designed to evaluate scenarios and decide whether to intercept a user's field of view or to notify the user of events using only an auditory signal. This type of smart audio interference is designed to maintain environmental awareness and invoke user attention to important events, ranging from device notifications to emergencies. This leaves the user's field of view clear so that the user can engage and maintain focus in his or her work.

The smart audio system defines a signal hierarchy or tier signal levels of audio interference based on the levels of priority of notifications. For example, extremely high-priority notifications include notifications for environmental emergencies and device-specific emergencies. High-priority notifications include phone calls and task notifications. Medium-priority notifications include texts and emails. Low-priority notifications include application updates and reminders. The higher the level of priority, the more likely the smart audio system will cause a display of the notification in the display of the HMD (within a field of view of the user) in addition to causing an auditory signal in the HMD (e.g., an audio notification with an adjusted volume level based on background noise).

In another example embodiment, the smart audio system also defines a task hierarchy based on the priority of each task. For example, enterprise-specific tasks can be assigned priority according to the enterprise's interest in having the user or worker be interrupted while performing the task. High-priority tasks or actions are not to be interrupted using notifications. Low-priority tasks allow for notification interruption. An example of a high-priority task includes fixing a gas leak in a pipe. An example of a low-priority task includes checking on a filter of a furnace.

The smart audio system decides whether to interrupt the user using a combination of visual notification (e.g., AR content in the display of the HMD) and audio notification (e.g., using speakers in the HMD) based on both the priority level of the notification and the priority level of the task. For example, the user of the HMD is currently performing a gas leak fix (which task is identified by the enterprise as a high-priority task). The task utilizes AR content and work instructions, as well as manual labor. The user's field of view cannot be obstructed much more than it is already obstructed by the AR content and instructions being displayed.

The smart audio system maintains environmental awareness of a current dBA/noise level around the user (e.g., an ambient-based context). Based on the measured dBA at the HMD, the smart audio system increases audio output volume to overcome environmental noise such that the user is able to hear the system (e.g., speakers in the HMD) without issue, and to receive messages without having to receive visual notifications. The smart audio system manipulates all notifications and all output to compensate for environmental noise. When noise levels decrease, so does the output volume. When the user stops performing the task (e.g., the task-based context changes), AR notifications resume as well.

The smart audio system makes context-based decisions (e.g., based on ambient-based context and task-based context) on how to best notify the user when environmental conditions are not favorable for traditional audio notifications and the message is to be delivered. The smart audio system bases its notification-type decisions on the following factors:

Priority of notification in comparison to priority of task.
Current task's priority.
Current environmental noise and its levels of acceptability.
Current audio settings on device (e.g., mute).

Audio notifications may be displayed in augmented/mixed reality or, when the situation calls for it, with very specific AR notifications. Audio notification is supplemented by specific AR content. For example, an emergency is unfolding in a specific location within a factory. All smart audio systems are notified via internal systems (e.g., out-of-band or alternative communication channels). The environment may be too loud to notify users via traditional audio. The smart audio system increases traditional audio output levels to overcome environmental noise and, optionally, supplements the traditional audio notification with AR content that shows a direction of "escape" away from danger (e.g., an exit plan).

If a danger is within an "unsafe distance" from the user, the smart audio system engages a "distance to safety" notification to notify the user of the emergency location and the user's proximity to it. The smart audio system can also play a notification that increases in intensity as the user moves closer to the location of the emergency, and decreases in intensity as the user moves away to a safe distance. When the user is out of harm's way, a unique audio notification is played to let the user know.

In one example embodiment, an HMD has a transparent display and an array of microphones embedded around the HMD. The array of microphones enables the HMD to pick up ambient sound and identify a location of a particular sound based on the audio data from the array of microphones. The HMD includes, for example, a helmet or glasses worn by a user while the user is performing a task. For example, the user wears the HMD to assist him or her in fixing a physical machine using AR information displayed and appearing as an overlay on top of the physical machine. The HMD determines a task-based context of the HMD based on a task being performed by the user of the HMD. For example, the HMD determines that the user is performing a complex task based on the information being requested or displayed in the transparent display of the HMD. In another example, the HMD determines that the user is performing a relatively easy task based on computer vision techniques to identify objects being manipulated by the user or an input from the user (e.g., the user selecting the type of task on a software application running on the HMD). Therefore, the task-based context identifies a difficulty or complexity of the task being performed by the user.

The HMD further determines an ambient-based context based on audio data produced by the array of microphones. For example, the HMD determines that an environment inside a factory is loud based on an ambient noise level detected by the array of microphones. The array of microphones can be used to detect an audio alert in the factory. For example, the array of microphones can pick up a siren or an audio warning signal that the user of the HMD has not paid attention to because he or she may be focused on completing a complicated task. In another example, the HMD receives an alert notification via a wireless (e.g., electrical) signal.

The HMD intercepts a notification and modifies the notification based on a priority level of the notification, the task-based context, and the ambient-based context. The modified notification comprises a combination of an audio notification and a visual notification. The visual notification includes AR content. For example, the HMD may increase an audio output volume of speakers in the HMD to notify the user of the audio alert. The HMD may also supplement the audio output by displaying the visual notification in the transparent display of the HMD. The visual notification may include an escape route specific to the emergency related to the audio alert. For example, the HMD displays a first escape route based on a fire alarm or a different escape route based on a different type of alarm or event.

In another example embodiment, the HMD determines a location of the audio alert (e.g., an incident source) using the array of microphones and generates the AR content based on the task-based context and the ambient-based context. The AR content identifies the location of the audio alert. The HMD displays the AR content in the transparent display.

In another example embodiment, to determine the task-based context, the HMD evaluates a level of difficulty of the task and determines a priority level of the task. The task-based context is based on the level of difficulty of the task and the priority level of the task.

In another example embodiment, to determine the task-based context, the HMD determines biometric data related to the user of the HMD. The biometric data identifies a physiological state of the user and a state of mind of the user while the user is performing the task. The task-based context is based on the biometric data.

In another example embodiment, to determine the ambient-based context, the HMD determines an ambient noise level, and identifies an audio setting of the HMD and an audio level of speakers in the HMD. The ambient-based context is based on the ambient noise level, the audio setting, and the audio level of the speakers in the HMD.

In another example embodiment, the HMD determines that the ambient noise level is above a first audio threshold and that the audio level of the speakers is below a second audio threshold. The HMD increases the audio level of the speakers in the HMD in response to determining that the ambient noise level is above the first audio threshold and the audio level of the speakers is below the second audio threshold. The HMD plays the notification at the increased audio level of the speakers in the HMD.

In another example embodiment, the AR content further identifies an event corresponding to the audio alert and a location of the event relative to an orientation and a position of the HMD.

In another example embodiment, the HMD accesses a floorplan corresponding to a location of the HMD. The AR content comprises an escape route based on the floorplan. The escape route corresponds to the event and the location of the event.

In another example embodiment, the HMD adjusts the audio notification in the HMD based on a location of the HMD relative to the location of the event. For example, the HMD increases an audio level or a frequency of the audio notification based on a distance between the location of the HMD and the location of the event.

In another example embodiment, the HMD includes an AR application that identifies an object in an image captured with a camera, retrieves a three-dimensional model of a virtual object from the AR content based on the identified object, and renders the three-dimensional model of the virtual object in the transparent display/display lens. The virtual object is perceived as an overlay on the real-world object.

The display surface of the HMD may be retracted inside the helmet and extended outside the helmet to allow a user to view the display surface. The position of the display surface may be adjusted based on an eye level of the user. The display surface includes a display lens capable of displaying AR content. The helmet may include a computing device such as a hardware processor with an AR application that allows the user wearing the helmet to experience information, such as in the form of a virtual object such as a three-dimensional (3D) virtual object, overlaid on an image or a view of a physical object (e.g., a gauge) captured with a camera in the helmet. The helmet may include optical sensors. The physical object may include a visual reference (e.g., a recognized image, pattern, or object, or unknown objects) that the AR application can identify using predefined objects or machine vision. A visualization of the additional information (also referred to as AR content), such as the 3D virtual object overlaid on or engaged with a view or an image of the physical object, is generated in the display lens of the helmet. The display lens may be transparent to allow the user to see through the display lens. The display lens may be part of a visor or face shield of the helmet or may operate independently from the visor of the helmet. The 3D virtual object may be selected based on the recognized visual reference or captured image of the physical object. A rendering of the visualization of the 3D virtual object may be based on a position of the display relative to the visual reference. Other AR applications allow the user to experience a visualization of the additional information overlaid on top of a view or an image of any object in the real physical world. The virtual object may include a 3D virtual object and/or a two-dimensional (2D) virtual object. For example, the 3D virtual object may include a 3D view of an engine part or an animation. The 2D virtual object may include a 2D view of a dialog box, menu, or written information such as statistics information for properties or physical characteristics of the corresponding physical object (e.g., temperature, mass, velocity, tension, stress). The AR content (e.g., the image of the virtual object, or the virtual menu) may be rendered at the helmet or at a server in communication with the helmet. In one example embodiment, the user of the helmet may navigate the AR content using audio and visual inputs captured at the helmet or other inputs from other devices, such as a wearable device. For example, the display lens may extract or retract based on a voice command of the user, a gesture of the user, or a position of a watch in communication with the helmet.

In another example embodiment, a non-transitory machine-readable storage device may store a set of instructions that, when executed by at least one processor, causes the at least one processor to perform the method operations discussed within the present disclosure.

FIG. 1 is a network diagram illustrating a network environment 100 suitable for operating an AR application of an HMD with display lenses, according to some example embodiments. The network environment 100 includes an HMD 101 and a server 110, communicatively coupled to each other via a network 108. The HMD 101 and the server 110 may each be implemented in a computer system, in whole or in part, as described below with respect to FIG. 12.

The server 110 may be part of a network-based system. For example, the network-based system may be or include a cloud-based server system that provides AR content (e.g., augmented information including 3D models of virtual objects related to physical objects in images captured by the HMD 101) to the HMD 101.

The HMD 101 may include a helmet or glasses that a user 102 may wear to view the AR content related to captured images of several physical objects (e.g., object A 116, object B 118) in a real-world physical environment 114 within the filed of view 120 of the HMD 101. In one example embodiment, the HMD 101 includes a computing device with a camera and a display (e.g., smart glasses, smart helmet, smart visor, smart face shield, or smart contact lenses). The computing device may be removably mounted to the head of the user 102. In one example, the display may be a screen that displays what is captured with a camera of the HMD 101. In another example, the display of the HMD 101 may be a transparent display, such as in the visor or face shield of a helmet, or a display lens distinct from the visor or face shield of the helmet.

The user 102 may be a user of an AR application in the HMD 101 and at the server 110. The user 102 may be a human user (e.g., a human being), a machine user (e.g., a computer configured by a software program to interact with the HMD 101), or any suitable combination thereof (e.g., a human assisted by a machine or a machine supervised by a human). The user 102 is not part of the network environment 100, but is associated with the HMD 101.

In one example embodiment, the AR application determines the AR content to be rendered and displayed in the transparent lenses of the HMD 101 based on sensor data related to the user 102 and sensor data related to the HMD 101. The sensor data related to the user 102 may include measurements of a heart rate, a blood pressure, brain activity, and biometric data related to the user 102. The sensor data related to the HMD 101 may include a geographic location of the HMD 101, an orientation and position of the HMD 101, an ambient pressure, an ambient humidity level, an ambient light level, and an ambient noise level detected by sensors in the HMD 101. The sensor data related to the user 102 may also be referred to as user-based sensor data. The sensor data related to the HMD 101 may be also referred to as ambient-based sensor data. For example, the HMD 101 may display first AR content when the user 102 wearing the HMD 101 is on the first floor of a building. The HMD 101 may display second AR content, different from the first AR content, when the user 102 is on the second floor of the building. In another example, the HMD 101 may display AR content when the user 102 is alert and located in front of machine M1. The HMD 101 may display different AR content when the user 102 is nervous or sleepy and is located in front of the same machine M1. In another example, the HMD 101 provides a first AR application (e.g., showing schematic diagrams of a building) when the user 102 is identified as a firefighter and is located on the first floor of a building. The HMD 101 may provide a second AR application (e.g., showing locations of non-functioning sprinklers) when the user 102 is identified as a firefighter and sensors in the building indicate temperature exceeding a threshold (e.g., because of a fire in the building). Therefore, different AR content and different AR applications may be provided to the HMD 101 based on a combination of the user-based sensor data and the ambient-based sensor data.

In another example embodiment, the AR application may provide the user 102 with an AR experience triggered by identified objects in the physical environment 114. The physical environment 114 may include identifiable objects such as a 2D physical object (e.g., a picture), a 3D physical object (e.g., a factory machine), a location (e.g., at the bottom floor of a factory), or any references (e.g., perceived corners of walls or furniture) in the real-world physical environment 114. The AR application may include computer vision recognition to determine corners, objects, lines, and letters. The user 102 may point a camera of the HMD 101 to capture an image of the objects A 116 and B 118 in the physical environment 114.

In one example embodiment, the objects A 116, B 118 in the image are tracked and recognized locally in the HMD 101 using a local context recognition dataset or any other previously stored dataset of the AR application of the HMD 101. The local context recognition dataset module may include a library of virtual objects associated with the real-world physical objects A 116, B 118 or references. In one example, the HMD 101 identifies feature points in an image of the objects A 116, B 118 to determine different planes (e.g., edges, corners, surface, dial, letters). The HMD 101 may also identify tracking data related to the objects A 116, B 118 (e.g., GPS location of the HMD 101, orientation, or distances to objects A 116, B 118). If the captured image is not recognized locally at the HMD 101, the HMD 101 can download additional information (e.g., 3D models or other augmented data) corresponding to the captured image, from a database of the server 110 over the network 108.

In another embodiment, the objects A 116, B 118 in the image are tracked and recognized remotely at the server 110 using a remote context recognition dataset or any other previously stored dataset of an AR application in the server 110. The remote context recognition dataset module may include a library of virtual objects or augmented information associated with the real-world physical objects A 116, B 118 or references.

Sensors 112 may be associated with, coupled to, or related to the objects A 116 and B 118 in the physical environment 114 to measure a location, information, or captured readings from the objects A 116 and B 118. Examples of captured readings may include, but are not limited to, weight, pressure, temperature, velocity, direction, position, intrinsic and extrinsic properties, acceleration, and dimensions. For example, the sensors 112 may be disposed throughout a factory floor to measure movement, pressure, orientation, and temperature. The server 110 can compute readings from data generated by the sensors 112. The server 110 can generate virtual indicators such as vectors or colors based on data from the sensors 112. Virtual indicators are then overlaid on top of a live image of the objects A 116 and B 118 to show data related to the objects A 116 and B 118. For example, the virtual indicators may include arrows with shapes and colors that change based on real-time data. The visualization may be provided to the HMD 101 so that the HMD 101 can render the virtual indicators in a display of the HMD 101. In another embodiment, the virtual indicators are rendered at the server 110 and streamed to the HMD 101. The HMD 101 displays the virtual indicators or visualization corresponding to a display of the physical environment 114 (e.g., data is visually perceived as displayed adjacent to the objects A 116 and B 118).

The sensors 112 may include other sensors used to track the location, movement, and orientation of the HMD 101 externally without having to rely on the sensors internal to the HMD 101. The sensors 112 may include optical sensors (e.g., depth-enabled 3D camera), wireless sensors (Bluetooth, Wi-Fi), GPS sensors, and audio sensors to determine the location of the user 102 having the HMD 101, a distance of the user 102 from the sensors 112 in the physical environment 114 (e.g., the sensors 112 being placed in corners of a venue or a room), and the orientation of the HMD 101 to track what the user 102 is looking at (e.g., a direction in which the HMD 101 is pointed, such as towards a player on a tennis court or at a person in a room).

In another embodiment, data from the sensors 112 and internal sensors in the HMD 101 may be used for analytics data processing at the server 110 (or another server) for analysis of usage and how the user 102 is interacting with the physical environment 114. Live data from other servers may also be used in the analytics data processing. For example, the analytics data may track at what locations (e.g., points or features) on a physical or virtual object the user 102 has looked, how long the user 102 has looked at each location on the physical or virtual object, how the user 102 moved with the HMD 101 when looking at the physical or virtual object, which features of the virtual object the user 102 interacted with (e.g., whether the user 102 tapped on a link in the virtual object), and any suitable combination thereof. The HMD 101 receives a visualization content dataset related to the analytics data. The HMD 101 then generates a virtual object with additional or visualization features, or a new experience, based on the visualization content dataset.

In another example embodiment, the AR application in the HMD 101 detects an audio/visual notification to be displayed in a display of the HMD 101. For example, the audio notification includes a beep or a message. The visual notification may include AR content displaying a message or a warning sign. In one example, another application operating on the HMD 101 generates the audio/visual notification. In another example, the HMD 101 wirelessly receives the audio/visual notification from another computing system. A smart audio application intercepts the audio/visual notification at the HMD 101 and determines a priority level (e.g., extremely important) associated with the audio/visual notification, a priority level of a task (e.g., a high-priority task) being performed by the user 102 of the HMD 101, and a context of the environment ambient to the HMD 101 (e.g., crowded, noisy environment, user of the HMD 101 attentively focused on task, user of the HMD 101 having a relatively high heart rate). The smart audio application then determines whether to adjust the volume in the HMD 101, whether to play an audio message at the adjusted volume, and whether to generate AR content identifying (or including) the visual notification in the display of the HMD 101 based on the priority level of the notification, the context of the environment, and the task associated with the user of the HMD 101. The smart audio application then generates a modified notification to be displayed or played at the HMD 101. In one example, the smart audio application increases a volume of the audio notification in addition to displaying an AR visual notification in the display of the HMD 101. Other types of notification such as haptic feedback can supplement the audio/visual notification.

Any of the machines, databases, or devices shown in FIG. 1 may be implemented in a general-purpose computer modified (e.g., configured or programmed) by software to be a special-purpose computer to perform one or more of the functions described herein for that machine, database, or device. For example, a computer system able to implement any one or more of the methodologies described herein is discussed below with respect to FIG. 12. As used herein, a "database" is a data storage resource and may store data structured as a text file, a table, a spreadsheet, a relational database (e.g., an object-relational database), a triple store, a hierarchical data store, or any suitable combination thereof. Moreover, any two or more of the machines, databases, or devices illustrated in FIG. 1 may be combined into a single machine, database, or device, and the functions described herein for any single machine, database, or device may be subdivided among multiple machines, databases, or devices.

The network 108 may be any network that enables communication between or among machines (e.g., the server 110), databases, and devices (e.g., the HMD 101). Accordingly, the network 108 may be a wired network, a wireless network (e.g., a mobile or cellular network), or any suitable combination thereof. The network 108 may include one or more portions that constitute a private network, a public network (e.g., the Internet), or any suitable combination thereof.

Figure 2:
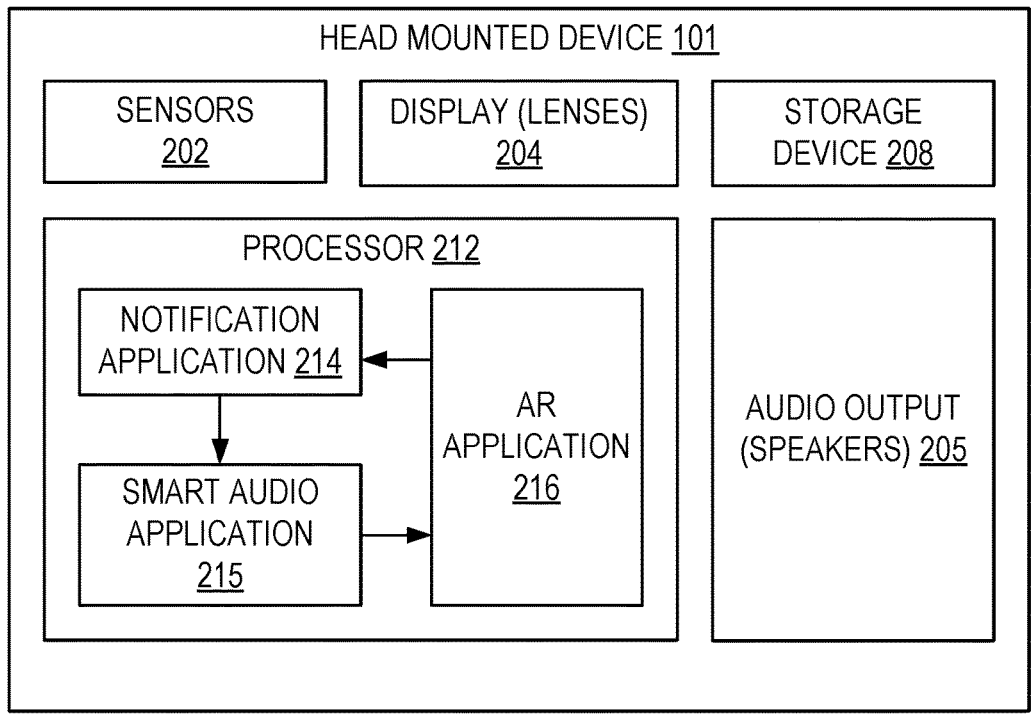
FIG. 2 is a block diagram illustrating an example embodiment of a head-mounted device (HMD).

FIG. 2 is a block diagram illustrating modules (e.g., components) of the HMD 101, according to some example embodiments. The HMD 101 may be a helmet that includes sensors 202, a display 204, audio output (e.g., speakers) 205, a storage device 208, and a processor 212. The HMD 101 may not be limited to a helmet and may include any type of device that can be worn on the head of a user, e.g., the user 102, such as glasses, a hat, or a visor.

The sensors 202 may be used to generate internal tracking data of the HMD 101 to determine a position and an orientation of the HMD 101. The position and the orientation of the HMD 101 may be used to identify real-world objects in a field of view of the HMD 101. For example, a virtual object may be rendered and displayed in the display 204 when the sensors 202 indicate that the HMD 101 is oriented towards a real-world object (e.g., when the user 102 looks at object A 116 that is within a field of view 120 of the sensors 202) or in a particular direction (e.g., when the user 102 tilts his head to watch his wrist). The HMD 101 may also display a virtual object based on a geographic location of the HMD 101. For example, a set of virtual objects may be accessible when the user 102 of the HMD 101 is located in a particular building. In another example, virtual objects including sensitive material may be accessible when the user 102 of the HMD 101 is located within a predefined area associated with the sensitive material and the user 102 is authenticated. Different levels of content of the virtual objects may be accessible based on a credential level of the user 102. For example, a user 102 who is an executive of a company may have access to more information or content in the virtual objects than a manager at the same company. The sensors 202 may be used to authenticate the user 102 prior to providing the user 102 with access to the sensitive material (e.g., information displayed as a virtual object such as a virtual dialog box in a see-through display). Authentication may be achieved via a variety of methods, such as providing a password or an authentication token, or using the sensors 202 to determine biometric data unique to the user 102.

Figure 3:
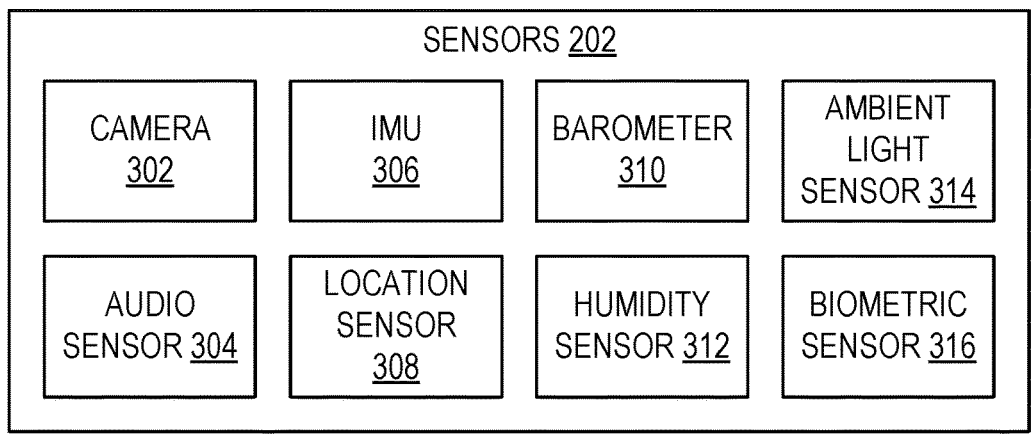
FIG. 3 is a block diagram illustrating examples of sensors.

FIG. 3 is a block diagram illustrating examples of the sensors 202 in the HMD 101. For example, the sensors 202 may include a camera 302, an audio sensor 304, an Inertial Measurement Unit (IMU) sensor 306, a location sensor 308, a barometer 310, a humidity sensor 312, an ambient light sensor 314, and a biometric sensor 316. It is to be noted that the sensors 202 described herein are for illustration purposes. Sensors 202 are thus not limited to the ones described.

The camera 302 includes an optical sensor(s) (e.g., a camera) that may encompass different spectrums. The camera 302 may include one or more external cameras aimed outside the HMD 101. For example, the external camera may include an infrared camera or a full-spectrum camera. The external camera may include a rear-facing camera and a front-facing camera disposed in the HMD 101. The front-facing camera may be used to capture a front field of view of the HMD 101, while the rear-facing camera may be used to capture a rear field of view of the HMD 101. The pictures captured with the front- and rear-facing cameras may be combined to recreate a 360-degree view of the physical world around the HMD 101.

The camera 302 may include one or more internal cameras aimed at the user 102. The internal camera may include an infrared (IR) camera configured to capture an image of a retina of the user 102. The IR camera may be used to perform a retinal scan to map unique patterns of the retina of the user 102. Blood vessels within the retina absorb light more readily than the surrounding tissue in the retina and therefore can be identified with IR lighting. The IR camera may cast a beam of IR light into the user 102's eye as the user 102 looks through the display 204 (e.g., lenses) towards virtual objects rendered in the display 204. The beam of IR light traces a path on the retina of the user 102. Because retinal blood vessels absorb more of the IR light than the rest of the eye, the amount of reflection varies during the retinal scan. The pattern of variations may be used as biometric data unique to the user 102.

In another example embodiment, the internal camera may include an ocular camera configured to capture an image of an iris of the eye of the user 102. In response to the amount of light entering the eye, muscles attached to the iris expand or contract the aperture at the center of the iris, known as the pupil. The expansion and contraction of the pupil depends on the amount of ambient light. The ocular camera may use iris recognition as a method for biometric identification. The complex pattern on the iris of the eye of the user 102 is unique and can be used to identify the user 102. The ocular camera may cast IR light to acquire images of detailed structures of the iris of the eye of the user 102. Biometric algorithms may be applied to the image of the detailed structures of the iris to identify the user 102.

In another example embodiment, the ocular camera includes an IR pupil dimension sensor that is pointed at an eye of the user 102 to measure the size of the pupil of the user 102. The IR pupil dimension sensor may sample the size of the pupil (e.g., using an IR camera) on a periodic basis or based on predefined trigger events (e.g., the user 102 walks into a different room, there are sudden changes in the ambient light, or the like).

The audio sensor 304 may include an array of microphones disposed around the HMD 101. For example, the array of microphones may be used to record a voice command from the user 102 of the HMD 101. In other examples, the array of microphones may be used to measure an ambient noise level to determine an intensity of background noise ambient to the HMD 101. In another example, the array of microphones may be used to capture ambient noise. Analytics may be applied to the captured ambient noise to identify specific types of noises such as explosions or gunshot noises. The array of microphones may be used to determine or identify a location or distance of the explosion relative to the HMD 101.

The IMU sensor 306 may include a gyroscope and an inertial motion sensor to determine an orientation and movement of the HMD 101. For example, the IMU sensor 306 may measure the velocity, orientation, and gravitational forces on the HMD 101. The IMU sensor 306 may also detect a rate of acceleration using an accelerometer, and changes in angular rotation using a gyroscope.

The location sensor 308 may determine a geolocation of the HMD 101 using a variety of techniques such as near field communication, GPS, Bluetooth, and Wi-Fi. For example, the location sensor 308 may generate geographic coordinates of the HMD 101.

The barometer 310 may measure an atmospheric pressure differential to determine an altitude of the HMD 101. For example, the barometer 310 may be used to determine whether the HMD 101 is located on a first floor or a second floor of a building.

The humidity sensor 312 may determine a relative humidity level ambient to the HMD 101. For example, the humidity sensor 312 determines the humidity level of a room in which the HMD 101 is located.

The ambient light sensor 314 may determine an ambient light intensity around the HMD 101. For example, the ambient light sensor 314 measures the ambient light in a room in which the HMD 101 is located.

The biometric sensor 316 include sensors configured to measure biometric data unique to the user 102 of the HMD 101. In one example embodiment, the biometric sensor 316 includes an ocular camera, an EEG (electroencephalogram) sensor, and an ECG (electrocardiogram) sensor. It is to be noted that the descriptions of biometric sensors 316 disclosed herein are for illustration purposes. The biometric sensor 316 is thus not limited to any of the ones described.

The EEG sensor includes, for example, electrodes that, when in contact with the skin of the head of the user 102, measure electrical activity of the brain of the user 102. The EEG sensor may also measure the electrical activity and wave patterns through different bands of frequency (e.g., Delta, Theta, Alpha, Beta, Gamma, Mu). EEG signals may be used to authenticate a user based on fluctuation patterns unique to the user.

The ECG sensor includes, for example, electrodes that measure a heart rate of the user 102. In particular, the ECG sensor may monitor and measure the cardiac rhythm of the user 102. A biometric algorithm is applied to the user 102 to identify and authenticate the user 102. In one example embodiment, the EEG sensor and ECG sensor may be combined into a same set of electrodes to measure both brain electrical activity and heart rate. The set of electrodes may be disposed around the helmet so that the set of electrodes comes into contact with the skin of the user 102 when the user 102 wears the HMD 101.

Referring back to FIG. 2, the display 204 may include a display surface or lens capable of displaying AR content (e.g., images or video) generated by the processor 212. The display 204 may be transparent so that the user 102 can see through the display 204 (e.g., such as in a head-up display).

The storage device 208 stores a library of AR content, types of notification data, notification priority level data, task data, ambient-based context data, user-based context data, and reference objects. The AR content may include two- or three-dimensional models of virtual objects with corresponding audio. In other examples, the AR content may include an AR application that includes interactive features such as displaying additional data (e.g., locations of sprinklers) in response to user input (e.g., a user says "show me the locations of the sprinklers" while looking at an AR overlay showing locations of the exit doors). AR applications may have their own different functionalities and operations. Therefore, each AR application may operate distinctly from other AR applications.

The types of notification data identify different types of notifications and their origins. For example, one type of notification may be a text message received from a peer device (e.g., another HMD). Another type of notification includes an audio message broadcast from a computer system. Other types of notification include phone call notifications, reminders, application updates, device-specific emergencies, environmental or ambient emergencies, and so forth.

The notification priority level data identifies a hierarchy or tier levels of priorities associated with the types of notifications. For example, an application update or a reminder is associated with a low notification priority level. In contrast, an emergency notification is associated with a high notification priority level.

The task data identifies tasks and their corresponding priority levels. For example, a task of fixing a gas leak corresponds to a high-priority task.

The ambient-based context data identifies ambient-based attributes from the sensors 202 associated with environmental data. For example, the ambient-based context data identifies an ambient noise level, a room temperature, a location, a humidity level, and so forth.

The user-based context data identifies user-based attributes from the sensors 202 associated with the user. For example, the user-based context data identifies a state of mind of the user (e.g., focused), physiological aspects of the user, reference biometric data, a user identification, and a user privilege level. For example, user-based context "UC1" is identified and triggered when the HMD 101 detects that the user (e.g., the user 102) is focused, not sweating, and identified as a technician. The state of mind of the user 102 may be measured with EEG or ECG sensors connected to the user 102 to determine a level of attention of the user 102 (e.g., distracted or focused). The physiological aspects of the user 102 may include biometric data that was previously captured and associated with the user 102 during a configuration process. The reference biometric data may include a unique identifier based on the biometric data of the user 102. The user identification may include the name and title of the user 102 (e.g., John Doe, VP of engineering). The user privilege level may identify which content the user 102 may have access to (e.g., access level 5 means that the user 102 may have access to content in virtual objects that are tagged with level 5). Other tags or metadata may be used to identify the user privilege level (e.g., "classified", "top secret", or "public").

The storage device 208 may also store a database of identifiers of wearable devices capable of communicating with the HMD 101. In another embodiment, the database may also identify reference objects (visual references or images of objects) and corresponding experiences (e.g., 3D virtual objects, or interactive features of the 3D virtual objects). The database may include a primary content dataset and a contextual content dataset. The primary content dataset includes, for example, a first set of images and corresponding experiences (e.g., interaction with 3D virtual object models). For example, an image may be associated with one or more virtual object models. The primary content dataset may include a core set of images or the most popular images determined by the server 110. The core set of images may include a limited number of images identified by the server 110. For example, the core set of images may include images depicting covers of the ten most-viewed devices and their corresponding experiences (e.g., virtual objects that represent the ten most-viewed sensing devices on a factory floor). In another example, the server 110 may generate the core set of images based on the most popular or often-scanned images received at the server 110. Thus, the primary content dataset does not depend on objects A 116 or B 118, or on images scanned by the HMD 101.

The contextual content dataset includes, for example, a second set of images and corresponding experiences (e.g., 3D virtual object models) retrieved from the server 110. For example, images captured with the HMD 101 that are not recognized (e.g., by the HMD 101) in the primary content dataset are submitted to the server 110 for recognition. If the captured image is recognized by the server 110, a corresponding experience may be downloaded at the HMD 101 and stored in the contextual content dataset. Thus, the contextual content dataset relies on the contexts in which the HMD 101 has been used. As such, the contextual content dataset depends on objects or images scanned by an AR application 216 of the HMD 101.

In one example embodiment, the HMD 101 may communicate over the network 108 with the server 110 to access a database of notification priority level data, task data, ambient-based context data, user-based context data, reference objects, and corresponding AR content at the server 110. The HMD 101 then compares a priority level of an intercepted notification with the notification priority level data, a task of a user of the HMD 101 with the task data, the ambient-based sensor data with attributes from the ambient-based context data, and the ambient-based sensor data with attributes from the user-based context data. The HMD 101 may also communicate with the server 110 to authenticate the user 102. In another example embodiment, the HMD 101 retrieves a portion of a database of visual references, corresponding 3D virtual objects, and corresponding interactive features of the 3D virtual objects.

The processor 212 may include a notification application 214, a smart audio application 215, and an AR application 216. The notification application 214 generates notifications or receives notifications from the AR application 216, from other applications operating on the processor 212, or from other computing devices wirelessly communicating with the HMD 101. The notification application 214 sends a command or request to the AR application 216 to display a visual notification in the display 204 of the HMD 101.

The smart audio application 215 detects notifications that are sent to the AR application 216 and intercepts them prior to the AR application 216 displaying or generating any notifications at the HMD 101. The smart audio application 215 evaluates and determines a suitable type of notification based on parameters such as notification priority level, task priority level, ambient-based context, and user-based context. The smart audio application 215 modifies or replaces the original notifications and provides the modified or new notifications to the AR application 216. In another example, the smart audio application 215 increases the volume of speakers 205 in the HMD 101 as a result of the evaluation of the suitable type of notification.

The AR application 216 generates a display of information related to the objects A 116, B 118. In one example embodiment, the AR application 216 generates a visualization of information related to the objects A 116, B 118 when the HMD 101 captures an image of the objects A 116, B 118 and recognizes the objects A 116, B 118, or when the HMD 101 is in proximity to the objects A 116, B 118. For example, the AR application 216 generates a display of a holographic or virtual menu visually perceived as a layer on the objects A 116, B 118. Furthermore, the AR application 216 generates AR content to represent the modified notification from the smart audio application 215.

Figure 4:
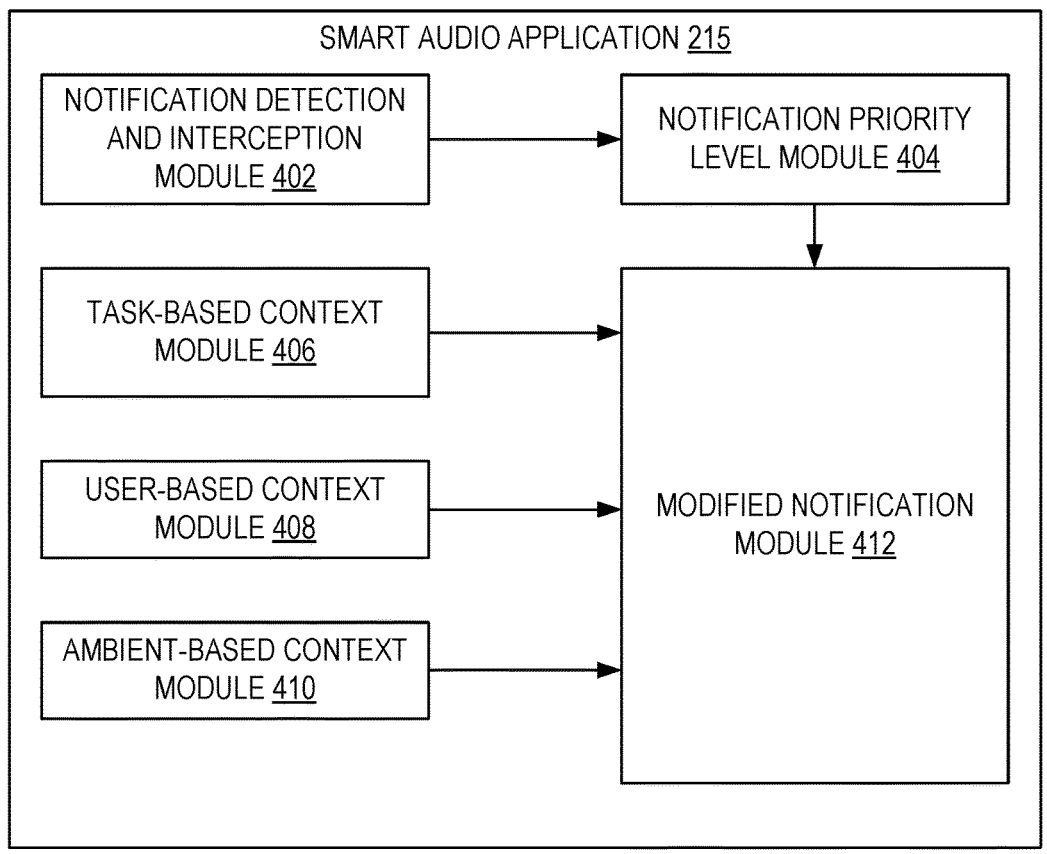
FIG. 4 is a block diagram illustrating an example embodiment of a smart audio application.

FIG. 4 is a block diagram illustrating an example embodiment of the smart audio application 215. The smart audio application 215 is shown by way of example to include a notification detection and interception module 402, a notification priority level module 404, a task-based context module 406, a user-based context module 408, an ambient-based context module 410, and a modified notification module 412.

The notification detection and interception module 402 detects whether a notification configured to be displayed in the display 204 is received. In one example, the notification detection and interception module 402 detects that an application operating on the HMD 101 has generated a notification to be displayed in the display 204. In another example, the notification detection and interception module 402 intercepts the request to display the notification from an application operating on the HMD 101 or from the AR application 216. In yet another example, the notification detection and interception module 402 includes a receiver configured to receive or detect a notification from a device external to the HMD 101. The notification detection and interception module 402 receives a notification signal from another computing device. The notification signal includes a request to display a notification on the display 204.

The notification priority level module 404 determines a priority level of the notification based on the type of notification (e.g., system warning, phone call, task notification, text, email, or reminder) and the originating source (e.g., a particular application, a particular peer HMD, or a specific server used for emergency notifications). For example, an emergency notification is associated with the highest priority level.

The task-based context module 406 determines the task being performed by the user of the HMD 101. For example, the task may be identified using computer vision to identify physical items within a preset distance and field of view of the HMD 101 and based on the location of the HMD 101. In another example, the task may be identified and selected by the user of the HMD 101 using the AR application 216 in the HMD 101. The task-based context module 406 further determines the priority level of the task being performed by the user. For example, fixing a gas leak is associated with the highest priority level. The priority level for each particular task may already be predefined and stored in the storage device 208.

The user-based context module 408 determines a user-based context based on user-based sensor data related to the user 102. The user-based context module 408 identifies the user-based context based on user-based sensor data matching attributes including user-based sensor data ranges defined in a library in the storage device 208 or in the server 110. For example, the user-based context module 408 determines that a user is nervous if his detected heart rate is above a predefined range. In another example, the user-based context module 408 identifies that the user is a junior technician performing a high-level task.

The ambient-based context module 410 determines an ambient-based context based on ambient-based sensor data related to the HMD 101. The ambient-based context module 410 identifies ambient-based context based on ambient-based sensor data matching attributes including ambient-based sensor data ranges defined in a library in the storage device 208 or in the server 110. For example, the ambient-based context identifies a loud environment with high humidity.

The modified notification module 412 determine an appropriate type of notification based on the notification priority level, the task-based context, the user-based context, and the ambient-based context. For example, the modified notification module 412 determines that an emergency notification is to be displayed in the display 204 while the user is performing a low-priority task with an audio notification using an increased volume level.

Any one or more of the modules described herein may be implemented using hardware (e.g., a processor 212 of a computer) or a combination of hardware and software. For example, any module described herein may configure a processor 212 to perform the operations described herein for that module. Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

Figure 5:
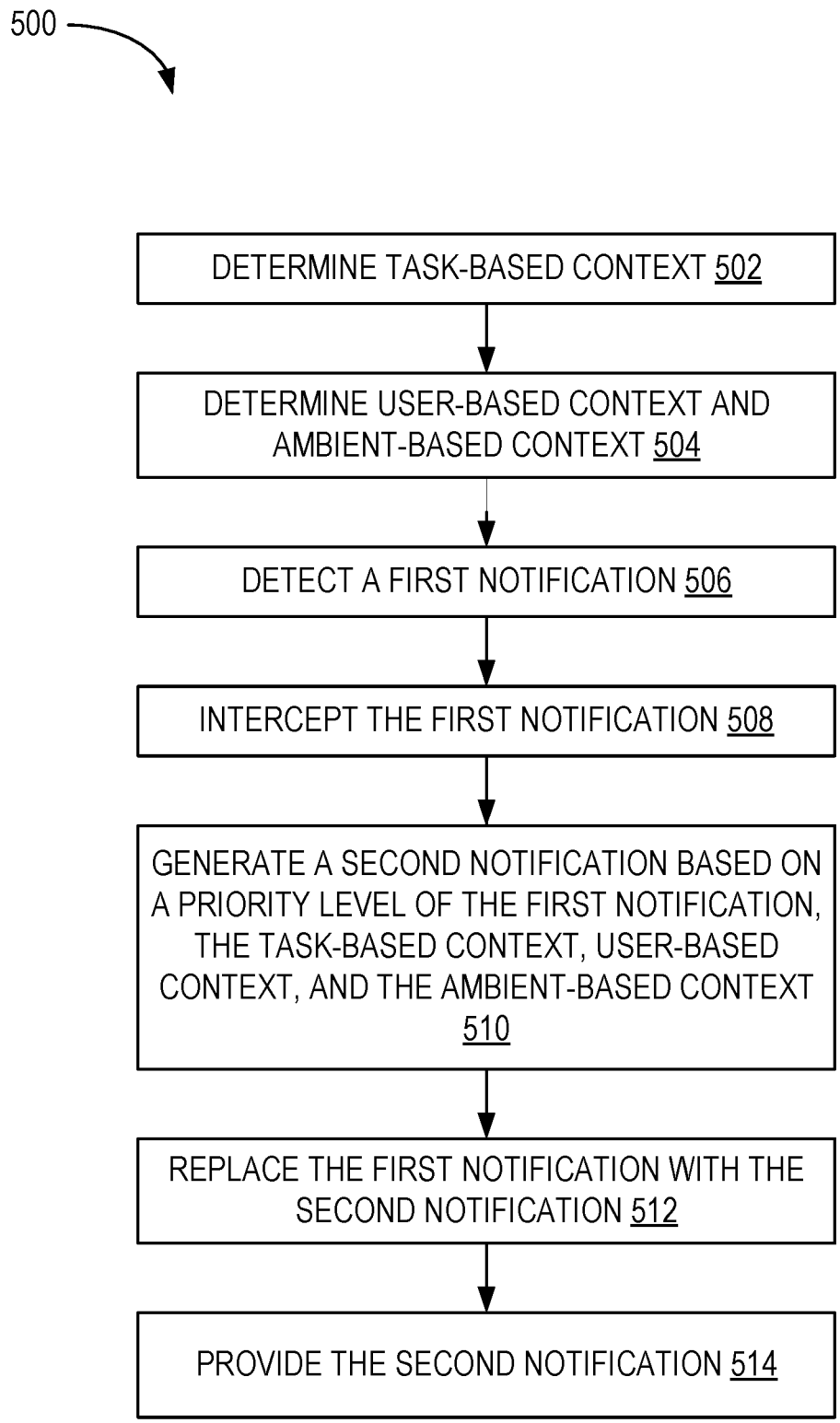
FIG. 5 is a flowchart illustrating a method for generating a notification, according to an example embodiment.

FIG. 5 is a flowchart illustrating a method 500 for generating a notification, according to an example embodiment. At operation 502, the smart audio application 215 determines the task-based context (e.g., task priority level, nature of the task). At operation 504, the smart audio application 215 determines the user-based context and ambient-based context. For example, the user-based context is based on a user profile (e.g., security clearance, specialty, and experience level) and sensor data from sensors connected to the user (e.g., heart rate). The ambient-based context is based on sensor data from sensors measuring the environment ambient to the HMD 101 (e.g., temperature, location, and humidity).

At operation 506, the smart audio application 215 detects a first notification generated by the notification application 214. In another example, the smart audio application 215 detects any notification configured to be displayed in the display 204 of the HMD 101. At operation 508, the smart audio application 215 intercepts the first notification between the notification application 214 and the AR application 216 to prevent the first notification from being displayed in the display 204 of the HMD 101.

At operation 510, the smart audio application 215 generates a second notification based on a priority level of the first notification, the task-based context, the user-based context, and the ambient-based context. At operation 512, the smart audio application 215 replaces the first notification with the second notification. At operation 514, the smart audio application 215 provides the second notification at the HMD 101. For example, the smart audio application 215 causes the AR application 216 to display the second notification as AR content in the display 204 in addition to increasing a volume of an audio notification of the second notification.

Figure 6:
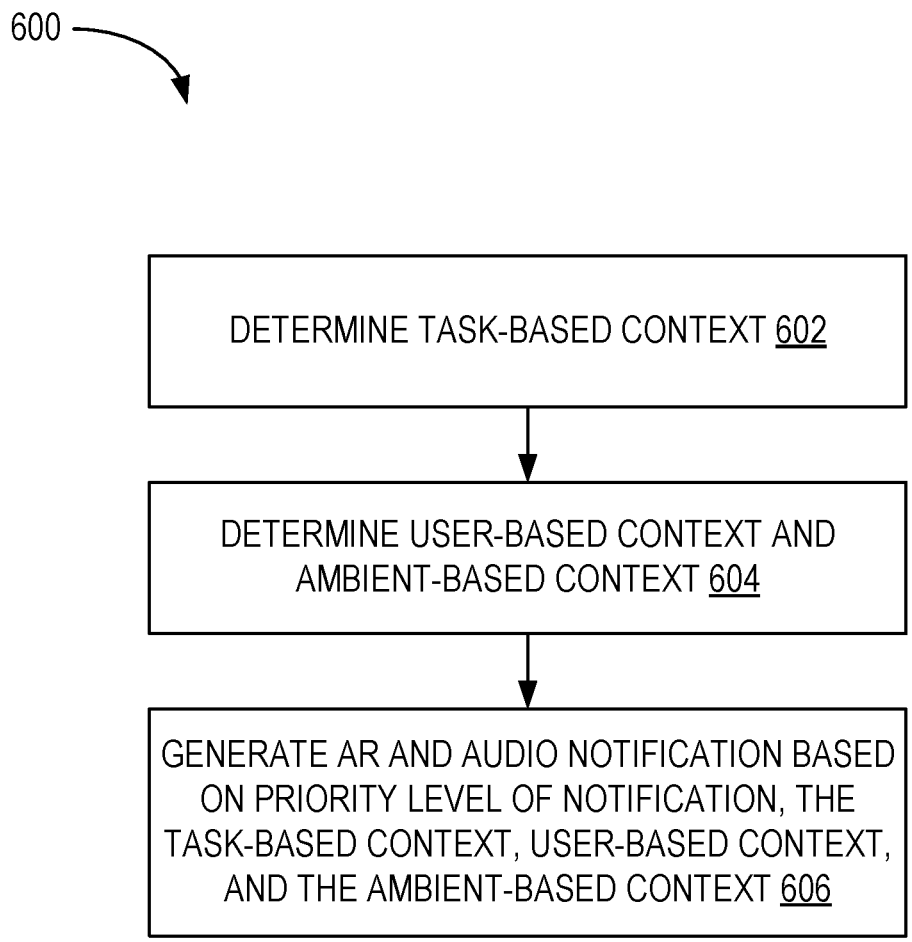
FIG. 6 is a flowchart illustrating a method for generating a notification, according to another example embodiment.

FIG. 6 is a flowchart illustrating a method 600 for generating a notification, according to another example embodiment. At operation 602, the smart audio application 215 determines the task-based context by identifying a priority level of the task being performed by the user of the HMD 101. Operation 602 can be implemented using the task-based context module 406.

At operation 604, the smart audio application 215 determines the user-based context and the ambient-based context.

Operation 604 can be implemented using the user-based context module 408 and the ambient-based context module 410.

At operation 606, the smart audio application 215 generates an AR and audio notification based on the priority level of the notification, the task-based context, the user-based context, and the ambient-based context.

Figure 7:
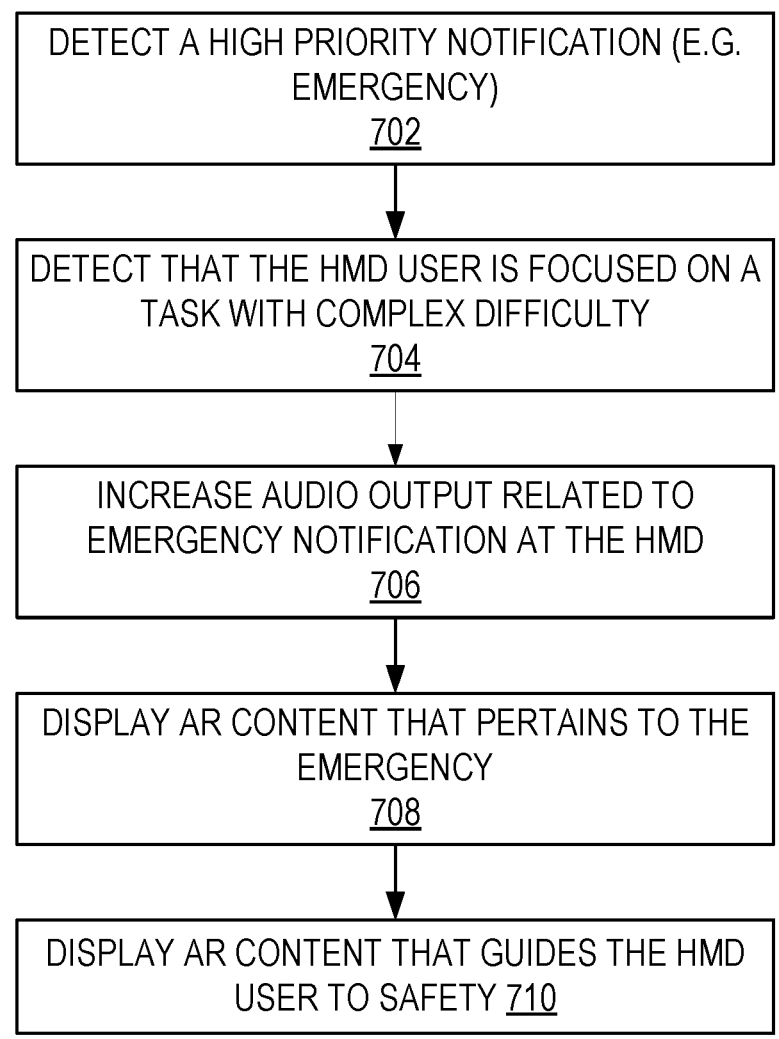
FIG. 7 is a flowchart illustrating a method for displaying augmented reality content, according to another example embodiment.

FIG. 7 is a flowchart illustrating a method 700 for displaying AR content, according to another example embodiment. At operation 702, the smart audio application 215 detects a high-priority notification (e.g., an emergency notification). At operation 704, the smart audio application 215 detects that the HMD 101 user is focused on a task with complex difficulty (e.g., fixing a complex part of a machine). At operation 706, the smart audio application 215 determines a loud ambient environment and increases an audio output volume related to the emergency notification at the HMD 101. At operation 708, the smart audio application 215 displays AR content that pertains to the emergency (e.g., AR content illustrating a type of emergency such as a leak or an explosion). At operation 710, the smart audio application 215 displays AR content that guides the HMD 101 user to safety away from the emergency.

Figure 8:
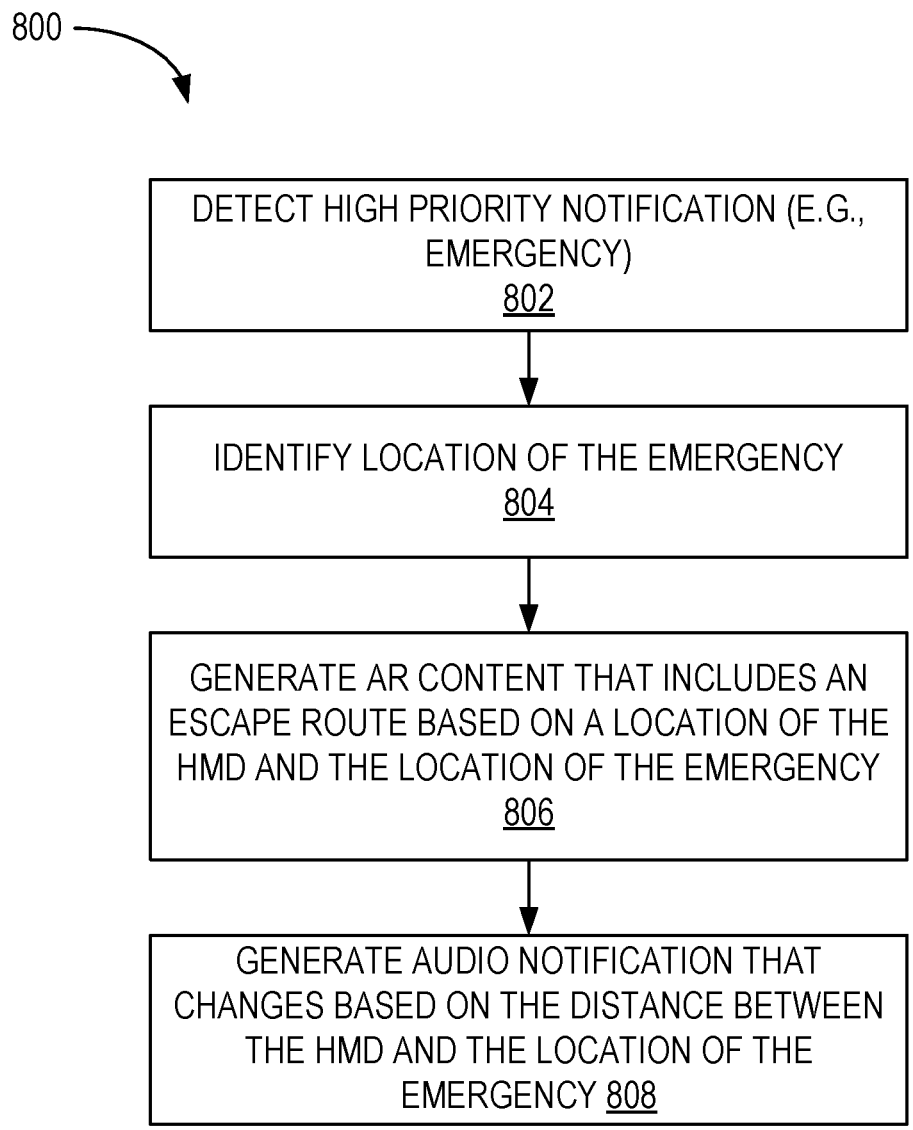
FIG. 8 is a flowchart illustrating a method for generating a notification that changes based on a distance, according to another example embodiment.

FIG. 8 is a flowchart illustrating a method 800 for generating a notification that changes based on a distance, according to another example embodiment. At operation 802, the smart audio application 215 detects a high-priority notification (e.g., an emergency notification). At operation 804, the smart audio application 215 identifies the location of the emergency using the array of microphones in the HMD 101. At operation 806, the smart audio application 215 retrieves floorplan data and generates AR content that includes an escape route based on the location of the HMD 101 and the location of the emergency. At operation 808, the smart audio application 215 generates an audio notification that changes based on the distance between the HMD and the location of the emergency.

Figure 9A:
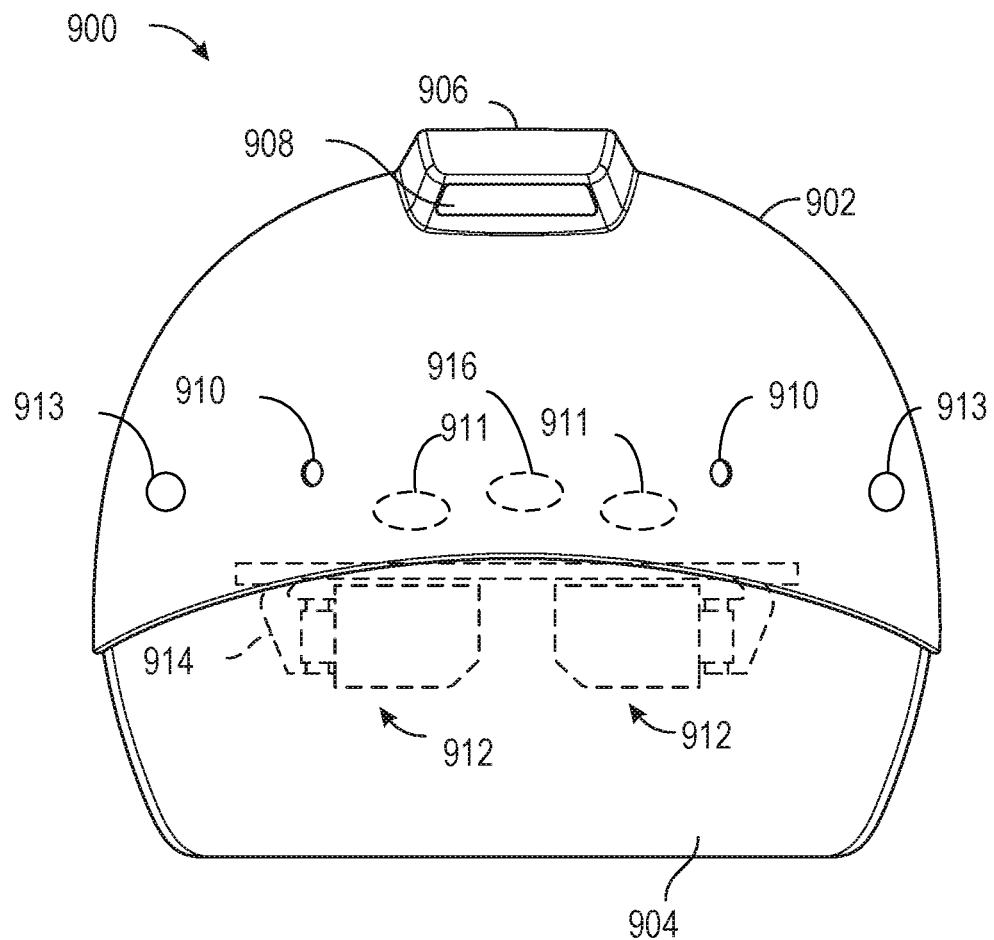
FIG. 9A is a block diagram illustrating a front view of a HMD, according to some example embodiments.
Figure 9B:
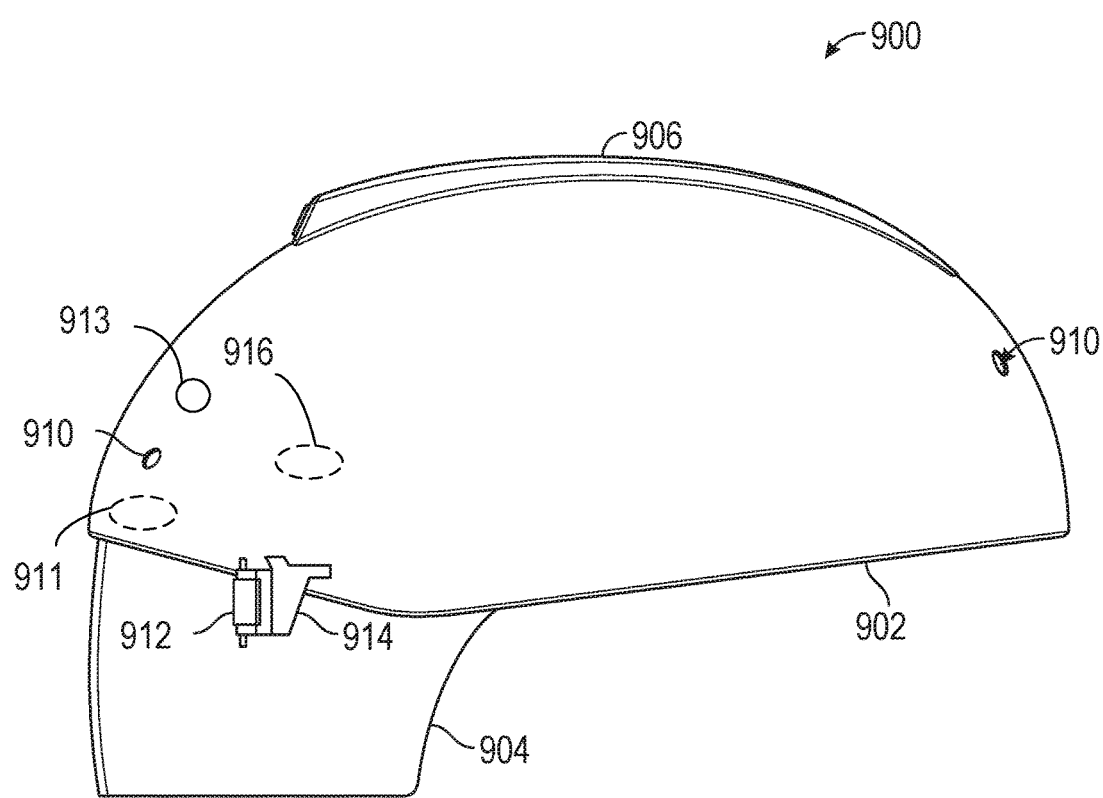
FIG. 9B is a block diagram illustrating a side view of the HMD of FIG. 9A.

FIG. 9A is a block diagram illustrating a front view of a head-mounted device (HMD) 900, according to some example embodiments. FIG. 9B is a block diagram illustrating a side view of the HMD 900 of FIG. 9A. The HMD 900 may be an example of the HMD 101 of FIG. 1. The HMD 900 includes a helmet 902 with an attached visor 904. The helmet 902 may include sensors (e.g., optical and audio sensors 908 and 910 provided at the front, back, and a top section 906 of the helmet 902). Display lenses 912 are mounted on a lens frame 914. The display lenses 912 include the display 204 of FIG. 2. The helmet 902 further includes ocular cameras 911. Each ocular camera 911 is directed to an eye of the user 102 to capture an image of the iris or retina. Each ocular camera 911 may be positioned on the helmet 902 above and facing a corresponding eye. The helmet 902 also includes EEG/ECG sensors 916 to measure brain activity and a heart rate pattern of the user 102.

In another example embodiment, the helmet 902 also includes lighting elements in the form of LED lights 913 on each side of the helmet 902. An intensity or brightness of the LED lights 913 is adjusted based on the dimensions of the pupils of the user 102. The AR application 216 may control lighting elements to adjust a size of the iris of the user 102. Therefore, the AR application 216 may capture images of the iris at different sizes for different virtual objects.

Figure 10:
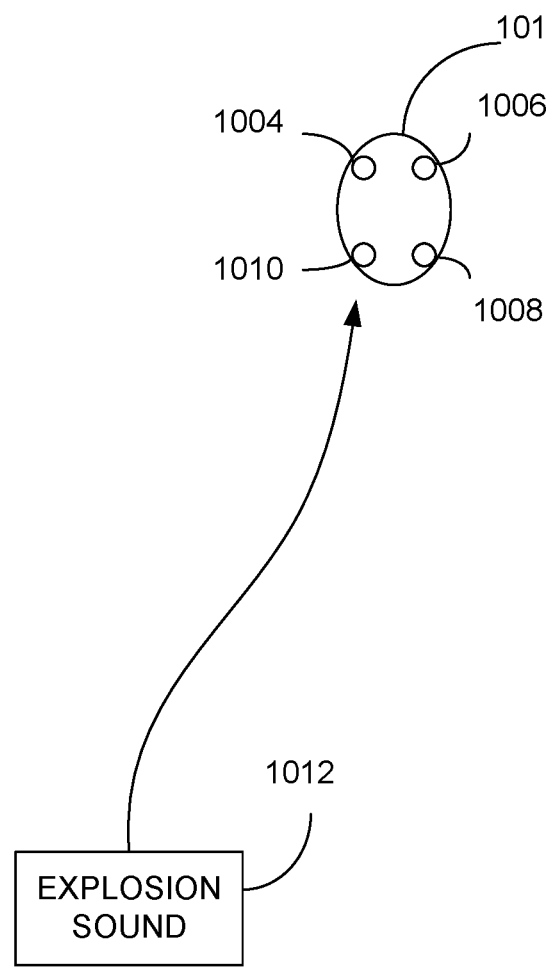
FIG. 10 is a block diagram illustrating an example of a HMD detecting an explosion sound.

FIG. 10 is a block diagram illustrating an example of a head-mounted device (HMD) 101 detecting an explosion sound. The HMD 101 includes an array of microphones 1004, 1006, 1008, and 1010 disposed around the HMD 101.

The HMD 101 detects a loud sound (e.g., a sound of an explosion 1012) with the array of microphones 1004, 1006, 1008, and 1010.

Figure 11:
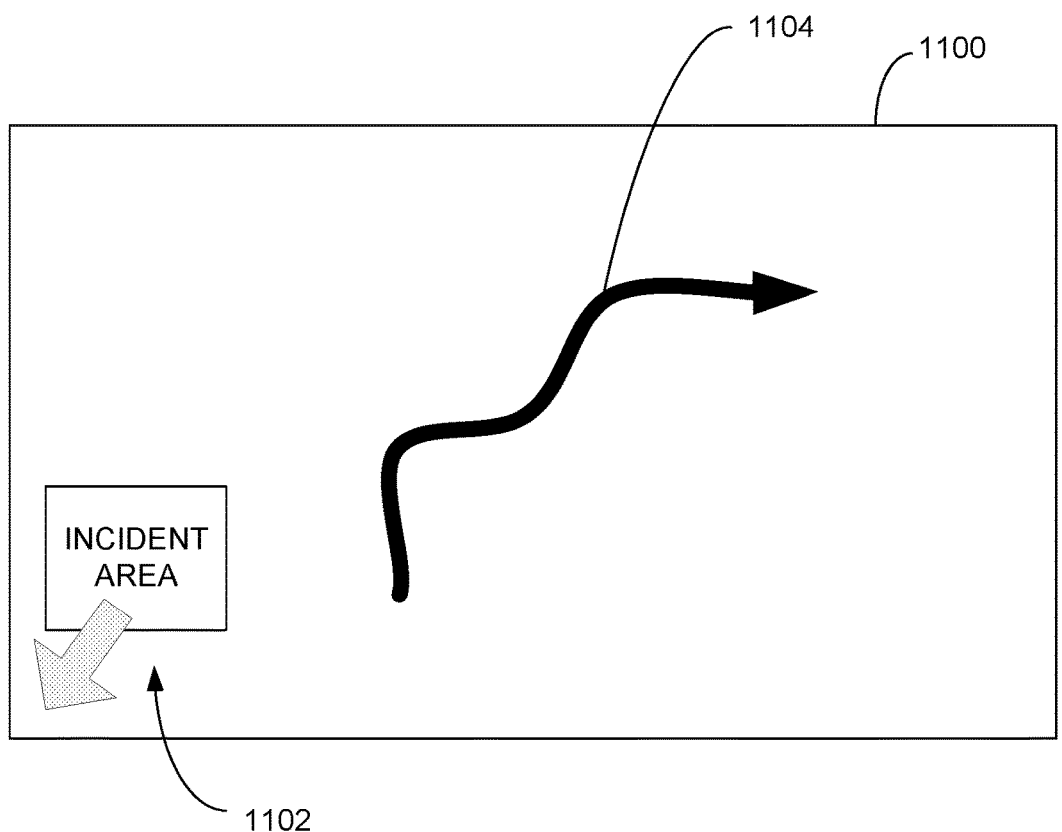
FIG. 11 is a block diagram illustrating an example of a display of the HMD in FIG. 10.

FIG. 11 is a block diagram illustrating an example of a transparent display 1100 of the HMD 101 in FIG. 10. The transparent display 1100 displays AR content that identifies a location of an incident area (e.g., an incident area indicator 1102) relative to the location and position of the HMD 101. The AR content further includes a virtual path 1104 displayed in the transparent display 1100. The virtual path 1104 is to guide the user to safety.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor 212 or a group of processors 212) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor 212 or other programmable processor 212) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor 212 configured using software, the general-purpose processor 212 may be configured as respective different hardware modules at different times. Software may accordingly configure a processor 212, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices and can operate on a resource (e.g., a collection of information).

The various operations of example methods described herein may be performed, at least partially, by one or more processors 212 that are temporarily configured (e.g., by software) or permanently configured to perform the relevant operations. Whether temporarily or permanently configured, such processors 212 may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors 212 or processor-implemented modules. The performance of certain of the operations may be distributed among the one or more processors 212, not only residing within a single machine, but deployed across a number of machines. In some example embodiments, the processor or processors 212 may be located in a single location (e.g., within a home environment, an office environment, or a server farm), while in other embodiments the processors 212 may be distributed across a number of locations.

The one or more processors 212 may also operate to support performance of the relevant operations in a "cloud computing" environment or as a "software as a service" (SaaS). For example, at least some of the operations may be performed by a group of computers (as examples of machines including processors 212), these operations being accessible via a network 108 and via one or more appropriate interfaces (e.g., application programming interfaces (APIs)).

Electronic Apparatus and System

Example embodiments may be implemented in digital electronic circuitry, in computer hardware, firmware, or software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor 212, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site or distributed across multiple sites and interconnected by a communication network 108.

In example embodiments, operations may be performed by one or more programmable processors 212 executing a computer program to perform functions by operating on input data and generating output. Method operations can also be performed by, and apparatus of example embodiments may be implemented as, special-purpose logic circuitry (e.g., an FPGA or an ASIC).

A computing system can include clients and servers 110. A client and server 110 are generally remote from each other and typically interact through a communication network 108. The relationship of client and server 110 arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor 212), or in a combination of permanently and temporarily configured hardware may be a design choice. Below are set out hardware (e.g., machine) and software architectures that may be deployed, in various example embodiments.

Example Machine Architecture

Figure 12:
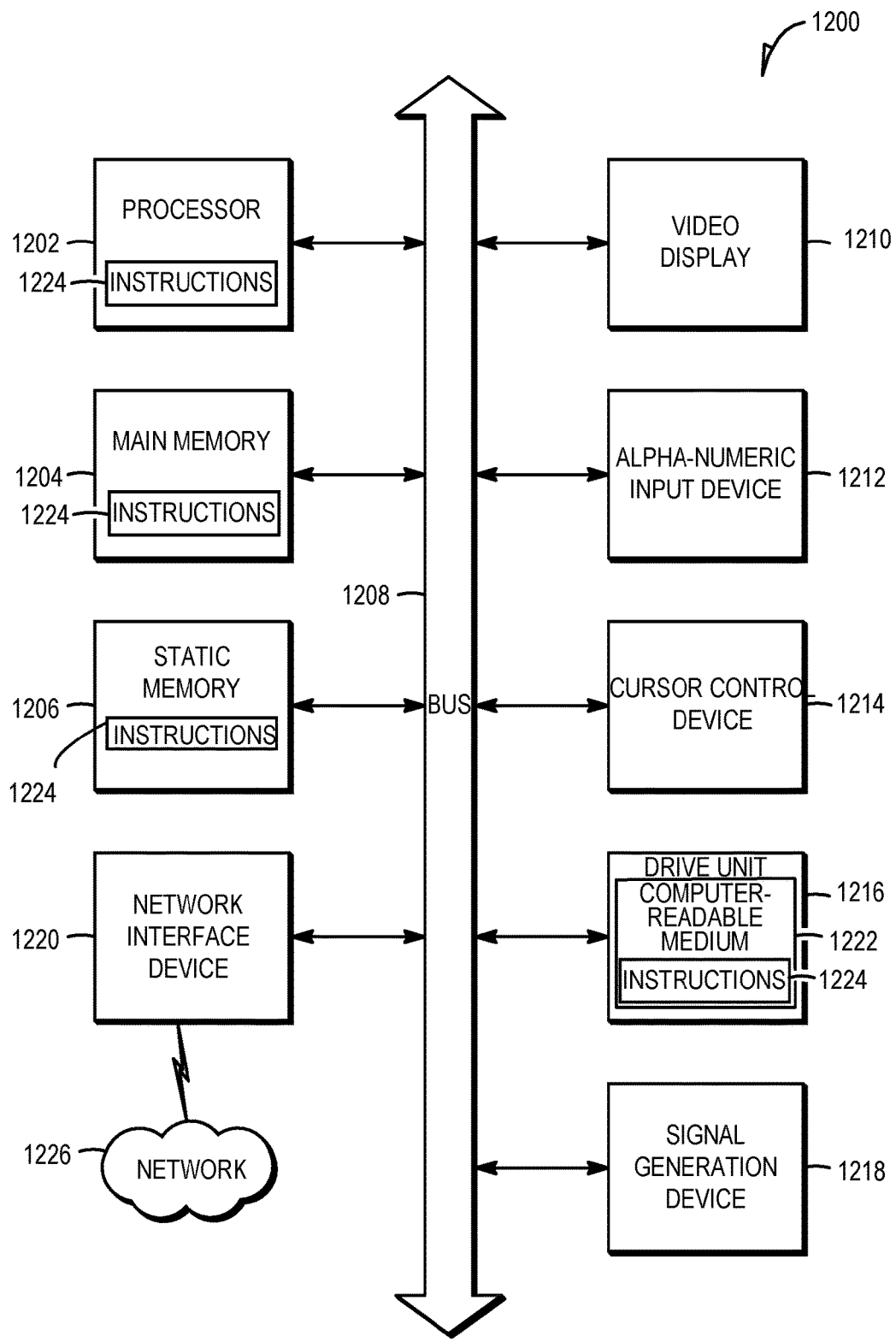
FIG. 12 is a block diagram illustrating components of a machine, according to some example embodiments, able to read instructions from a machine-readable medium and perform any one or more of the methodologies discussed herein.

FIG. 12 is a block diagram of a machine in the example form of a computer system 1200 within which instructions 1224 for causing the machine to perform any one or more of the methodologies discussed herein may be executed. In alternative embodiments, the machine operates as a stand-alone device or may be connected (e.g., networked) to other machines. In a networked deployment, the machine may operate in the capacity of a server 110 or a client machine in a server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, a network switch, a network bridge, or any machine capable of executing instructions 1224 (sequential or otherwise) that specify actions to be taken by that machine. Further, while only a single machine is illustrated, the term "machine" shall also be taken to include any collection of machines that individually or jointly execute a set (or multiple sets) of instructions 1224 to perform any one or more of the methodologies discussed herein.

The example computer system 1200 includes a processor 1202 (e.g., a central processing unit (CPU), a graphics processing unit (GPU), or both), a main memory 1204, and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard), a user interface (UI) navigation (or cursor control) device 1214 (e.g., a mouse), a disk drive unit 1216, a signal generation device 1218 (e.g., a speaker), and a network interface device 1220.

Machine-Readable Medium

The disk drive unit 1216 includes a machine-readable medium 1222 on which is stored one or more sets of data structures and instructions 1224 (e.g., software) embodying or utilized by any one or more of the methodologies or functions described herein. The instructions 1224 may also reside, completely or at least partially, within the main memory 1204 and/or within the processor 1202 during execution thereof by the computer system 1200, the main memory 1204 and the processor 1202 also constituting machine-readable media 1222. The instructions 1224 may also reside, completely or at least partially, within the static memory 1206.

While the machine-readable medium 1222 is shown in an example embodiment to be a single medium, the term "machine-readable medium" may include a single medium or multiple media (e.g., a centralized or distributed database, and/or associated caches and servers 110) that store the one or more instructions 1224 or data structures. The term "machine-readable medium" shall also be taken to include any tangible medium that is capable of storing, encoding, or carrying instructions 1224 for execution by the machine and that cause the machine to perform any one or more of the methodologies of the present embodiments, or that is capable of storing, encoding, or carrying data structures utilized by or associated with such instructions 1224. The term "machine-readable medium" shall accordingly be taken to include, but not be limited to, solid-state memories, and optical and magnetic media. Specific examples of machine-readable media 1222 include non-volatile memory, including by way of example semiconductor memory devices (e.g., erasable programmable read-only memory (EPROM), electrically erasable programmable read-only memory (EEPROM), and flash memory devices); magnetic disks such as internal hard disks and removable disks; magneto-optical disks; and compact disc-read-only memory (CD-ROM) and digital versatile disc (or digital video disc) read-only memory (DVD-ROM) disks.

Transmission Medium

The instructions 1224 may further be transmitted or received over a communication network 1226 using a transmission medium. The instructions 1224 may be transmitted using the network interface device 1220 and any one of a number of well-known transfer protocols (e.g., hypertext transfer protocol (HTTP)). Examples of communication networks 1226 include a local-area network (LAN), a wide-area network (WAN), the Internet, mobile telephone networks, plain old telephone service (POTS) networks, and wireless data networks (e.g., Wi-Fi and WiMax networks). The term "transmission medium" shall be taken to include any intangible medium capable of storing, encoding, or carrying instructions 1224 for execution by the machine, and includes digital or analog communications signals or other intangible media to facilitate communication of such software.

Although an embodiment has been described with reference to specific example embodiments, it will be evident that various modifications and changes may be made to these embodiments without departing from the scope of the present disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A head-mounted device (HMD) comprising:
   a transparent display;
   an array of microphones; and
   one or more hardware processors comprising a notification application, the notification application being configured to perform operations comprising:
      determining a task-based context of the HMD based on a detection of a task being performed by a user of the HMD;
      determining an ambient-based context of the HMD based on audio data produced by the array of microphones;
      intercepting a first notification configured to be displayed in the transparent display of the HMD;
      generating a second notification based on a priority level of the first notification, the task-based context, and the ambient-based context, the second notification comprising a combination of an audio notification and a visual notification, the visual notification including augmented reality (AR) content;
      replacing the first notification with the second notification; and
      providing the second notification at the HMD.

2. The HMD of claim 1, wherein the operations further comprise:
   detecting an audio alert using the array of microphones;
   determining a location of the audio alert using the array of microphones;
   generating the AR content based on the task-based context and the ambient-based context, the AR content identifying the location of the audio alert; and
   causing the AR content to be displayed in the transparent display.

3. The HMD of claim 1, wherein determining the task-based context further comprises:
   evaluating a level of difficulty of the task; and
   determining a priority level of the task,
   wherein the task-based context is determined based on the level of difficulty of the task and the priority level of the task.

4. The HMD of claim 3, wherein determining the task-based context further comprises:
   determining biometric data related to the user of the HMD, the biometric data identifying a physiological state of the user and a state of mind of the user while the user is performing the task,
   wherein the task-based context is determined based on the biometric data.

5. The HMD of claim 1, wherein determining the ambient-based context further comprises:
   determining an ambient noise level; and
   identifying an audio setting of the HMD and an audio level of speakers in the HMD,
   wherein the ambient-based context is determined based on the ambient noise level, the audio setting, and the audio level of the speakers in the HMD.

6. The HMD of claim 5, wherein the operations further comprise:
   determining that the ambient noise level is above a first audio threshold;
   determining that the audio level of the speakers is below a second audio threshold;
   increasing the audio level of the speakers in the HMD in response to determining that the ambient noise level is above the first audio threshold and the audio level of the speakers is below the second audio threshold; and
   playing the audio notification at the increased audio level of the speakers in the HMD.

7. The HMD of claim 1, wherein the AR content further identifies:
   an event corresponding to an audio alert; and
   a location of the event relative to an orientation and a position of the HMD.

8. The HMD of claim 7, wherein the operations further comprise:
   accessing a floorplan corresponding to a location of the HMD,
   wherein the AR content further comprises an escape route based on the floorplan, the escape route corresponding to the event and the location of the event.

9. The HMD of claim 7, wherein the operations further comprise:
   increasing an audio level of the audio notification based on a distance between the location of the HMD and the location of the event.

10. The HMD of claim 7, wherein the operations further comprise:
    increasing a frequency of the audio notification based on a distance between the location of the HMD and the location of the event.

11. A method comprising:
    determining a task-based context of a head-mounted device (HMD) based on a detection of a task being performed by a user of the HMD;
    determining an ambient-based context of the HMD based on audio data produced by an array of microphones at the HMD;
    intercepting a first notification configured to be displayed in the transparent display of the HMD;
    generating a second notification based on a priority level of the first notification, the task-based context, and the ambient-based context, the second notification comprising a combination of an audio notification and a visual notification, the visual notification including augmented reality (AR) content;
    replacing the first notification with the second notification; and
    providing the second notification at the HMD.

12. The method of claim 11, further comprising:
detecting an audio alert using the array of microphones;
determining a location of the audio alert using the array of microphones;
generating the AR content based on the task-based context and the ambient-based context, the AR content identifying the location of the audio alert; and
causing the AR content to be displayed in the transparent display.

13. The method of claim 11, wherein determining the task-based context further comprises:
evaluating a level of difficulty of the task; and
determining a priority level of the task,
wherein the task-based context is determined based on the level of difficulty of the task and the priority level of the task.

14. The method of claim 13, wherein determining the task-based context further comprises:
determining biometric data related to the user of the HMD, the biometric data identifying a physiological state of the user and a state of mind of the user while the user is performing the task,
wherein the task-based context is determined based on the biometric data.

15. The method of claim 11, wherein determining the ambient-based context further comprises:
determining an ambient noise level; and
identifying an audio setting of the HMD and an audio level of speakers in the HMD,
wherein the ambient-based context is determined based on the ambient noise level, the audio setting, and the audio level of the speakers in the HMD.

16. The method of claim 15, further comprising:
determining that the ambient noise level is above a first audio threshold;
determining that the audio level of the speakers is below a second audio threshold;
increasing the audio level of the speakers in the HMD in response to determining that the ambient noise level is above the first audio threshold and the audio level of the speakers is below the second audio threshold; and
playing the audio notification at the increased audio level of the speakers in the HMD.

17. The method of claim 11, wherein the AR content further identifies:
an event corresponding to an audio alert; and
a location of the event relative to an orientation and a position of the HMD.

18. The method of claim 17, further comprising:
accessing a floorplan corresponding to a location of the HMD,
wherein the AR content further comprises an escape route based on the floorplan, the escape route corresponding to the event and the location of the event.

19. The method of claim 17, further comprising:
adjusting the audio notification in the HMD based on a location of the HMD relative to the location of the event.

20. A non-transitory computer-readable medium comprising instructions that, when executed by one or more processors of a machine, cause the machine to perform operations comprising:
determining a task-based context of a head-mounted device (HMD) based on a detection of a task being performed by a user of the HMD;
determining an ambient-based context of the HMD based on audio data produced by an array of microphones at the HMD;
intercepting a first notification configured to be displayed in the transparent display of the HMD;
generating a second notification based on a priority level of the first notification, the task-based context, and the ambient-based context, the second notification comprising a combination of an audio notification and a visual notification, the visual notification including augmented reality (AR) content;
replacing the first notification with the second notification; and
providing the second notification at the HMD.

* * * * *